US00RE44531E

(19) United States
(12) Reissued Patent
Hsu et al.

(10) Patent Number: US RE44,531 E
(45) Date of Reissued Patent: Oct. 8, 2013

(54) MANUFACTURING PROCESS OF THIN FILM TRANSISTOR

(75) Inventors: Min-Ching Hsu, Taipei (TW); Yung-Lung Mo, Taipei (TW)

(73) Assignee: Intellectual Ventures Fund 82 LLC, Wilmington, DE (US)

(21) Appl. No.: 13/403,800

(22) Filed: Feb. 23, 2012 (Under 37 CFR 1.47)

Related U.S. Patent Documents

Reissue of:
(64) Patent No.: 7,666,725
Issued: Feb. 23, 2010
Appl. No.: 12/338,511
Filed: Dec. 18, 2008

U.S. Applications:
(62) Division of application No. 11/223,161, filed on Sep. 8, 2005, now Pat. No. 7,508,036.

(51) Int. Cl.
*H01L 21/84* (2006.01)

(52) U.S. Cl.
USPC ..... 438/158; 257/E21.561

(58) Field of Classification Search
USPC ..... 438/151–166; 257/E21.561
See application file for complete search history.

(56) References Cited

U.S. PATENT DOCUMENTS

| | | | | |
|---|---|---|---|---|
| 4,459,739 | A | 7/1984 | Shepherd et al. | |
| 5,432,108 | A * | 7/1995 | Lee | 438/157 |
| 5,981,972 | A | 11/1999 | Kawai et al. | |
| 6,197,625 | B1 * | 3/2001 | Choi | 438/158 |
| 7,508,036 | B2 | 3/2009 | Hsu et al. | |
| 7,666,725 | B2 | 2/2010 | Hsu et al. | |

* cited by examiner

*Primary Examiner* — Richard A. Booth
(74) *Attorney, Agent, or Firm* — Woodcock Washburn LLP

(57) ABSTRACT

A thin film transistor includes a gate, a gate insulator layer, a channel layer, a source, a drain, and an ohmic contact layer. The gate insulator layer covers the gate; the channel layer is disposed on the gate insulator layer above the gate; the source and the drain are disposed on the channel layer; the ohmic contact layer is disposed between the channel layer and the source and drain. The ohmic contact layer is constituted by a number of film layers. As mentioned above, the thin film transistor has an ohmic contact layer constituted by a number of film layers. When the thin film transistor is turned off, the current leakage thereof is lowered than that of a conventional thin film transistor.

10 Claims, 4 Drawing Sheets

MANUFACTURING PROCESS OF THIN FILM TRANSISTOR

Matter enclosed in heavy brackets [ ] appears in the original patent but forms no part of this reissue specification; matter printed in italics indicates the additions made by reissue.

CROSS-REFERENCE TO RELATED APPLICATION

[This application] *This is a reissue of U.S. Pat. No. 7,666,725, issued Feb. 23, 2010, filed as U.S. patent application Ser. No. 12/338,511, filed Dec. 18, 2008, which* is a divisional of [an] application Ser. No. 11/223,161, filed on Sep. 8, 2005, now [allowed] *U.S. Pat. No. 7,508,036, issued on Mar. 24, 2009*. The entirety of each of the above-mentioned patent applications is hereby incorporated by reference herein and made a part of this specification.

BACKGROUND OF THE INVENTION

1. Field of the Invention

The present invention relates to a thin film transistor and manufacturing process thereof. More particularly, the present invention relates to a thin film transistor and manufacturing process thereof, the current leakage thereof is reduced while the thin film transistor is turned off.

2. Description of Related Art

In recent years, it has become more easy and fast for manufacturing thin film transistors with the advance in manufacturing technology of semiconductor. The appliance of thin film transistors is so widely in many fields such as chips for computer or mobile phones or thin film transistor liquid crystal display (TFT LCD) apparatuses. In TFT LCD apparatuses, the thin film transistors are served as the switches to discharge or charge the storage capacitors.

FIG. 1 is a cross-sectional view of a conventional thin film transistor. The conventional thin film transistor 100 is formed on a glass substrate 110. It comprises a gate 120, an insulator layer 130, an amorphous layer 140, an N-doped amorphous silicon layer 150, a source 160 and a drain 170. A material of the gate 120 is alloy utilized for turning on or off the electrical channel in the amorphous layer 140. The gate 120 is coated with the insulator layer 130 which is made of silicon nitride to prevent the gate 120 and the amorphous layer 140 from electrically connected. The amorphous layer 140 is disposed on the insulator layer 130 to be served as the channel for transmitting electrons. A portion of the amorphous layer 140 is covered with the N-doped amorphous silicon layer 150 to be served as an ohmic contact layer, so as to lower the impedance between the source 160 and the amorphous layer 140 and between the drain 170 and the amorphous layer 140. The materials of the source 160 and the drain 170 are metal and they are disposed on the N-doped amorphous silicon layer 150.

An electrical channel will be formed on the bottom of the amorphous layer 140 while a voltage is applied to the gate 120 of the thin film transistor 100. The electrons can be flowed to the drain 170 through the electrical channel while another voltage is also provided to the drain 170. The electrical channel formed on the bottom of the amorphous layer 140 will be disappeared while no voltage is provided to the gate 120, so the source 160 and the drain 170 have become open circuit. However, because the conventional thin film transistor 100 is not a flawless switch actually, the source 160 and the drain 170 is not an absolutely open circuit whether no voltage or a negative voltage is provided to the gate 120. In other words, little current will be still flowed through the N-doped amorphous silicon layer 150 and the surface of the amorphous layer 140 to be the leakage current between the source 160 and the drain 170 when the conventional thin film transistor 100 is turned off. For instance, if the voltage difference between the source 160 and the drain 170 is 10V and the voltage of gate is −6V, the leakage current between the source 160 and the drain 170 is about $10^{-11}$ and $10^{-12}$ amp.

SUMMARY OF THE INVENTION

Accordingly, the present invention is directed to a thin film transistor, which has lower current leakage when turned off than that of the conventional thin film transistor.

Accordingly, the present invention is directed to a manufacturing process of thin film transistor which can fabricate a thin film transistor having lower current leakage when turned off than that of the conventional thin film transistor.

The thin film transistor is disclosed in the present invention. It comprises a gate, a gate insulator layer, a channel layer, a source, a drain and an ohmic contact layer. The gate is covered by the gate insulator layer. The channel layer is disposed on the gate insulator layer over the gate. The source and drain are disposed on the channel layer. The ohmic contact layer is disposed between the channel layer and the source and between the channel layer and the drain, wherein the ohmic contact layer is constituted by a plurality of film layers.

According to an embodiment of the present invention, wherein the ohmic contact layer is constituted by a plurality of N-doped amorphous silicon layers.

According to an embodiment of the present invention, wherein a material of the channel layer comprises amorphous silicon.

According to an embodiment of the present invention, wherein a material of the gate comprises metal.

According to an embodiment of the present invention, the first, wherein a material of the source and the drain comprises metal.

According to an embodiment of the present invention, wherein a material of the gate insulator layer is selected from one of silicon oxide, silicon nitride and the combination thereof.

The manufacturing process of thin film transistor is disclosed in the present invention. It comprises the following steps. First, a gate is formed on a substrate. And then, a gate insulator layer is formed on the substrate to cover the gate. Next, a channel layer is formed on the gate insulator layer over the gate. Afterwards, an ohmic contact layer is formed on the channel layer, wherein the ohmic contact layer is constituted by a plurality of film layers. Thereafter, a source and a drain are formed on the ohmic contact layer, and the ohmic contact layer located between the source and the drain is removed.

According to an embodiment of the present invention, wherein a method of forming the ohmic contact layer comprises that utilizing a deposition process, wherein a deposition power is changed during the deposition process so as to form a plurality of film layers to constitute the ohmic contact layer having a plurality of film layers. And a way to change the deposition power during the deposition process comprises that turning off the power at a predetermined time interval during the deposition process.

According to an embodiment of the present invention, wherein a method of forming the ohmic contact layer comprises that utilizing a deposition process, wherein a deposition pressure condition is changed during the deposition process condition so as to form a plurality of film layers to constitute the ohmic contact layer having a plurality of film layers. And a way to change the deposition pressure condition during the deposition process comprises that changing the pressure at a predetermined time interval during the deposition process, so as to lower the deposition rate.

According to an embodiment of the present invention, wherein the ohmic contact layer is constituted by a plurality of N-doped amorphous silicon layers.

As afore-mentioned, in the present invention, a thin film transistor and manufacturing process thereof, the electron mobility will be reduced because the ohmic contact layer is constituted by a plurality of film layers. Hence, when the thin film transistor is turned off, the current leakage thereof is lowered than that of conventional thin film transistor. Moreover, when the thin film transistor is turned on, the amount of current of thin film transistor will not change due to the ohmic contact layer constituted by a plurality of film layers.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Various specific embodiments of the present invention are disclosed below, illustrating examples of various possible implementations of the concepts of the present invention. The following description is made for the purpose of illustrating the general principles of the invention and should not be taken in a limiting sense. The scope of the invention is best determined by reference to the appended claims.

Figure 1:
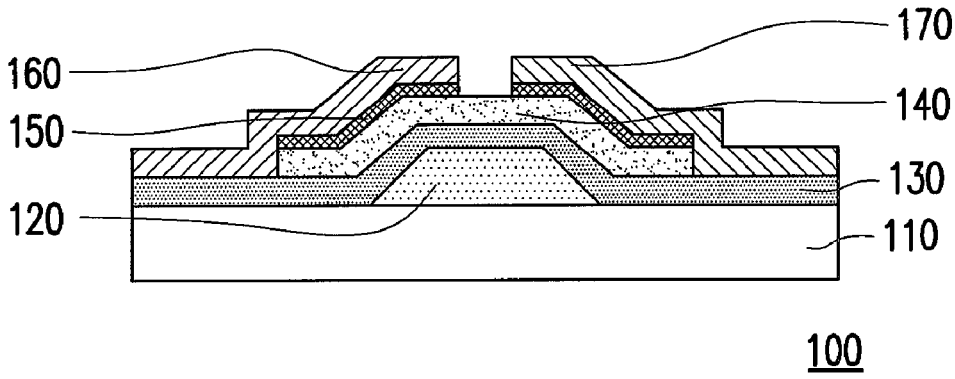
FIG. 1 (PRIOR ART)
FIG. 1 is a cross-sectional view of a conventional thin film transistor.
Figure 2A:
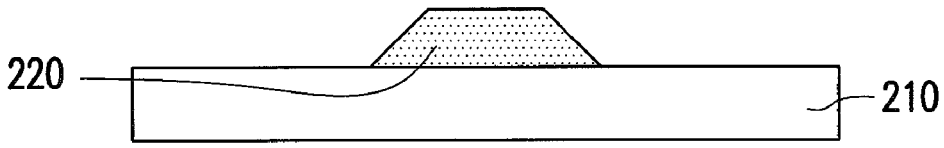
FIGS. 2A to 2E show a manufacturing process of a thin film transistor according to one embodiment of the present invention.

FIGS. 2A to 2E show a manufacturing process of a thin film transistor according to one embodiment of the present invention. Referring to FIG. 2A, in the present invention, the manufacturing process of a thin film transistor includes the following steps. A substrate 210 is provided first, wherein the substrate 210 is a glass substrate or another substrate made of other appropriate materials, for example. Next, a gate 220 is formed on the substrate 210, and a method of forming the gate 220 includes a thin film deposition process, a photolithography process and an etching process.

Figure 2B:
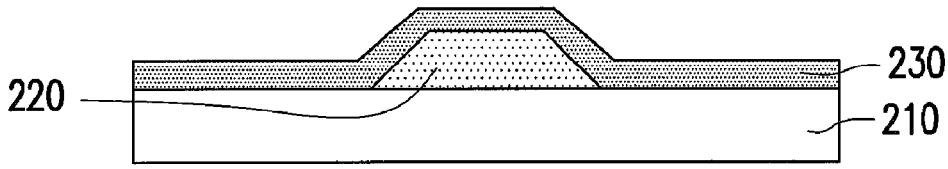

Referring to FIG. 2B, then a gate insulator layer 230 is formed on the substrate 210 and the gate 220 to cover the gate 220, and a method of forming the gate insulator layer 230 comprises a chemical vapor deposition (CVD) process.

Figure 2C:
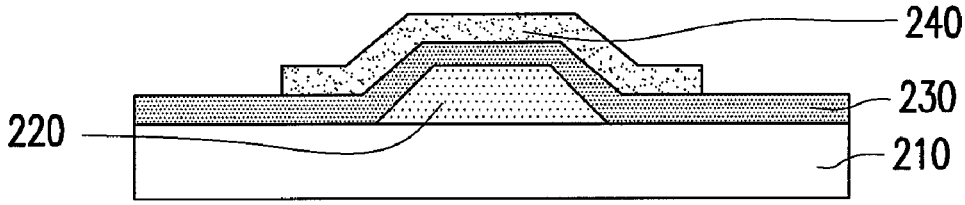

Referring to FIG. 2C, after the gate insulator layer 230 has formed, a channel layer 240 is next formed on the gate insulator layer 230 over the gate 220, and a method of forming the channel layer 240 includes a thin film deposition process, a photolithography process and an etching process.

Figure 2D:
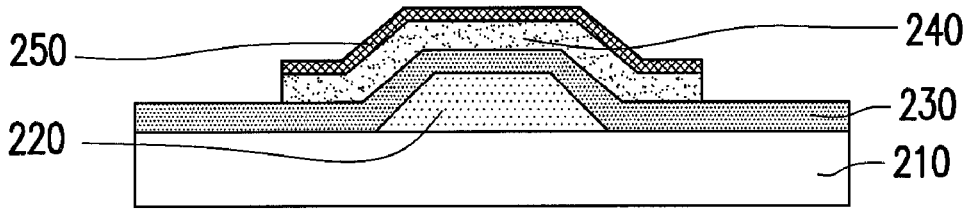

Referring to FIG. 2D, afterwards, an ohmic contact layer 250 is formed on the channel layer 240, wherein the ohmic contact layer 250 is constituted by a plurality of film layers, for instance. A method of forming the ohmic contact layer 250 comprises a chemical vapor deposition (CVD) process. As above-mentioned, the deposition power can be changed, for example, by utilizing the chemical vapor deposition (CVD) process to deposit the ohmic contact layer 250, so as to deposit a plurality of film layers on the channel layer 240 to form the ohmic contact layer 250 having a plurality of film layers. It should be noted that, a method of changing the deposition power comprises that turning off the power at a predetermined time interval during the deposition process. Additionally, the deposition pressure condition can be changed, for example, by utilizing the chemical vapor deposition (CVD) process to deposit the ohmic contact layer 250, so as to deposit a plurality of film layers on the channel layer 240 to form the ohmic contact layer 250 having a plurality of film layers. Wherein, a method of changing the deposition pressure condition comprises that changing the pressure at a predetermined time interval during the deposition process, so as to lower the deposition rate.

Figure 2E:
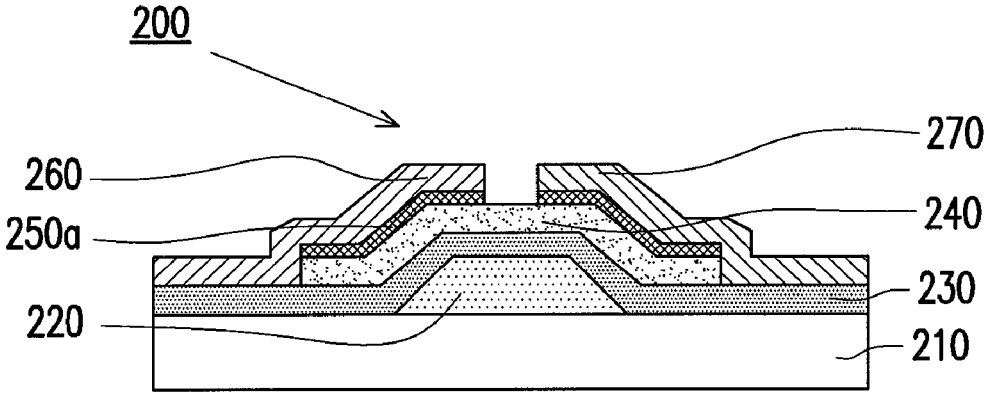

Referring to FIG. 2E, after the ohmic contact layer 250 is deposited, then a source 260 and a drain 270 are formed on the ohmic contact layer 250. Thereafter, the ohmic contact layer 250 located between the source 260 and the drain 270 is removed so that the ohmic contact layer 250a disposed between the source 260 and the channel layer 240 and between the drain 270 and channel layer 240 is remained. Hence, the manufacture of a thin film transistor 200 of the present invention in one embodiment is completed. With regarded to the structure of the thin film transistor 200 and the function of the elements thereof will be described as followings.

Referring to FIG. 2E, the thin film transistor 200 including a gate 220, a gate insulator layer 230, a channel layer 240, an ohmic contact layer 250a, a source 260, a drain 270.

Located on the bottom of the thin film transistor 200 is the gate 220, a material thereof is metal, for example. The gate 220 is mainly utilized for controlling the thin film transistor 200 to be turned on or turned off. For instance, when a turn on voltage is applied to the gate 220, the thin film transistor 200 is turned on; when a turn off voltage is applied to the gate 220, the thin film transistor 200 is turned off.

The gate insulator layer 230 is located on the gate 220 to cover the gate 220, wherein a material of the gate insulator layer 230 comprises silicon oxide, silicon nitride or the combination thereof, for instance. The gate insulator layer 230 enables the gate 220 and the channel layer 240 to be electrically insulated.

The channel layer 240 is disposed on the gate insulator layer 230 over the gate 220, a material of the channel layer 240 can be amorphous silicon. The channel layer 240 can provide the electrical channel, so the electrical charge will flow therethrough. When a positive voltage is applied to the gate 220, the electrical channel will be formed on the bottom of the channel layer 240, so the electrons can flow through the electrical channel, in other words, the thin film transistor 200 is turned on.

The ohmic contact layer 250a is disposed on a portion of the channel layer 240 and is located between the source 260 and the channel layer 240 and between the drain 270 and channel layer 240. The ohmic contact layer 250a comprises a plurality of film layers, a material thereof is N-doped amorphous silicon. The ohmic contact layer 250a is utilized for lowering the contact impedance between the source 260 and the channel layer 240 and between the drain 270 and channel layer 240. Because the ohmic contact layer 250a comprises a plurality of film layers, an interface between two neighboring film layers will impede the electron migration, so that the electron mobility will be reduced slightly. However, when the thin film transistor is turned off, the current leakage thereof will be reduced significantly thereby than that of conventional thin film transistor.

The source 260 and the drain 270 are located over the channel layer 240, and the ohmic contact layer 250a is located between the source 260 and the channel layer 240 and between the drain 270 and channel layer 240. A material of the source 260 and the drain 270 can be metal to be served as the conducting wires for transmitting charge.

Figure 3A:
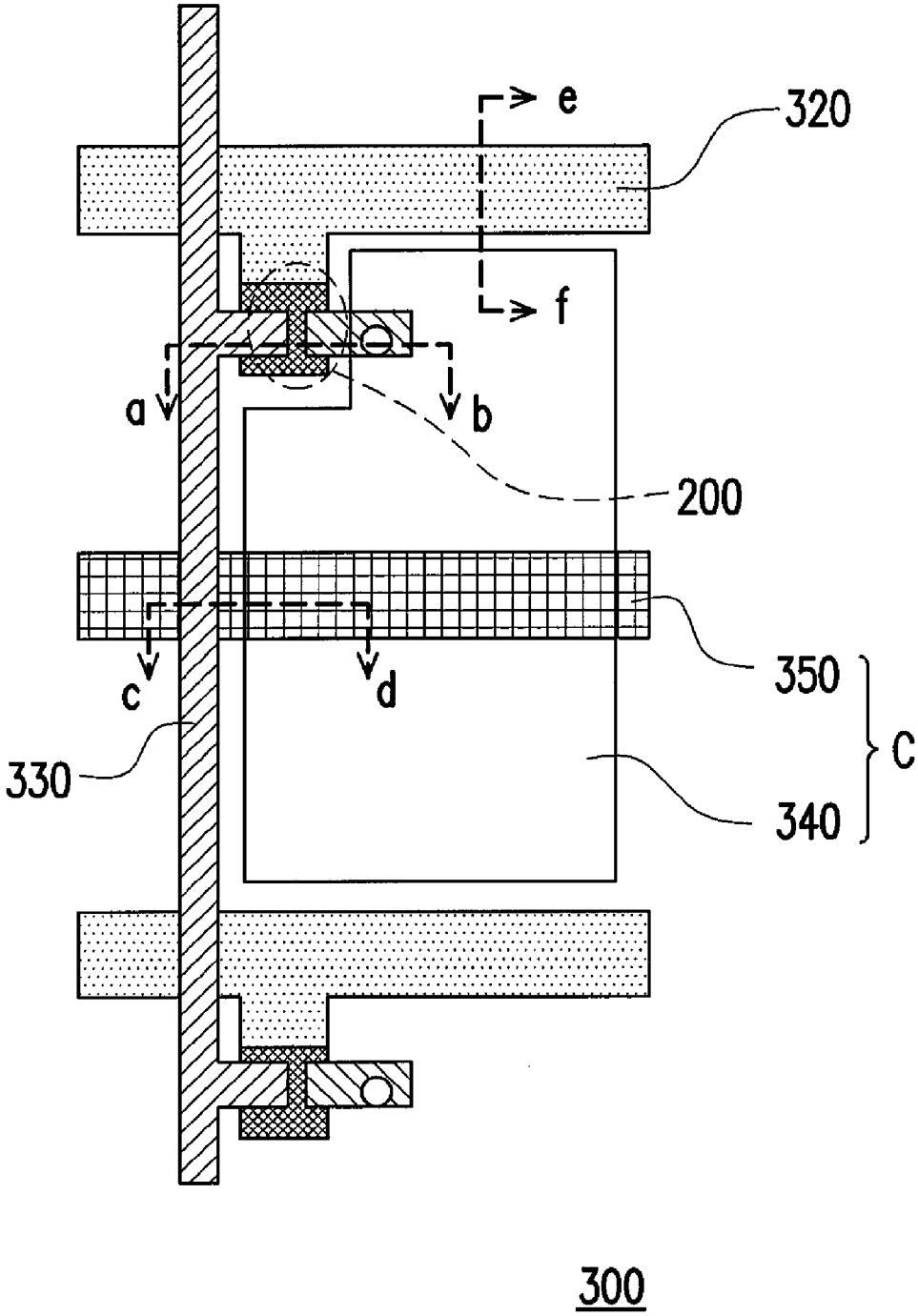
FIG. 3A is a top view of a thin film transistor array substrate, which is a portion of a liquid crystal display apparatus.
Figure 3B:
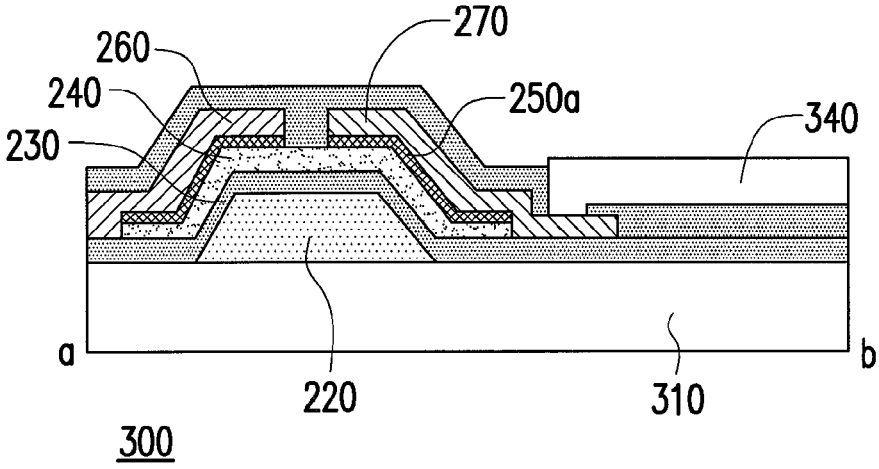
FIGS. 3B, 3C and 3D are cross-sectional views of the thin film transistor array substrate shown in FIG. 3A taken along lines a-b, c-d and e-f respectively.
Figure 3C:
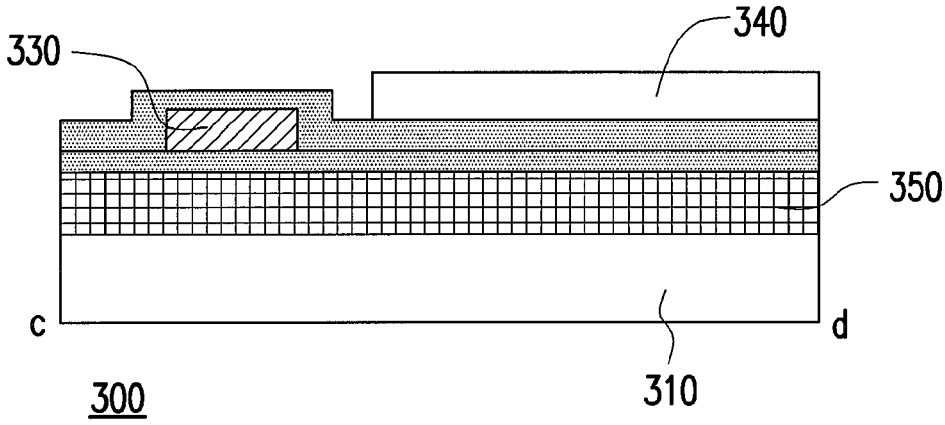
Figure 3D:
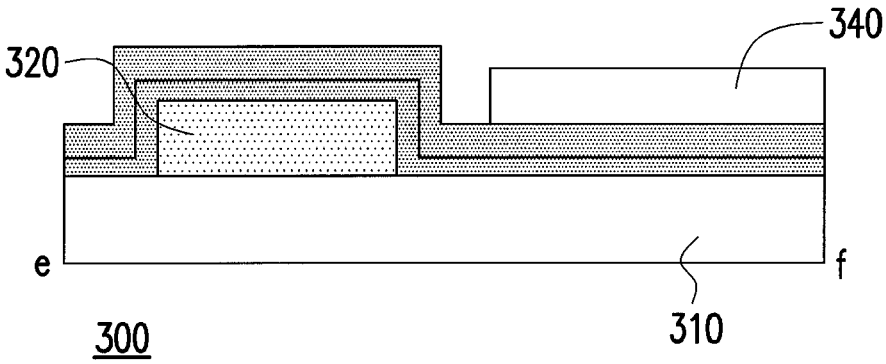

It should be noted that, the thin film transistor 200 is served as a switch element when applied to the liquid crystal display apparatus. FIG. 3A is a top view of a thin film transistor array substrate, which is a portion of a liquid crystal display apparatus. FIGS. 3B, 3C and 3D are cross-sectional views of the thin film transistor array substrate shown in FIG. 3A taken along lines a-b, c-d and e-f respectively. Referring to FIGS. 3A to 3D, the thin film transistor array substrate 300 includes a substrate 300, a plurality of scan lines 320, a plurality of data lines 330, a plurality of pixel electrodes 340, a plurality of storage capacitor lines 350 and a plurality of thin film transistors 200. The gate 220 of the thin film transistor 200 is electrically connected with the scan lines 320, the source 260 is electrically connected with the data lines 330, and the drain 270 is electrically connected with the pixel electrodes 340, for example. A storage capacitor C is formed by the pixel electrodes 340 and the storage capacitor lines 350. When a turn on voltage is applied to the gate 220 via the scan lines 320, the thin film transistor 200 is turned on and an electrical channel is formed on the bottom of the channel layer 240. When a signal voltage is applied to the source 260 via the data lines 330, the charge will flow from the source 260 into the drain 270 by the electrical channel to charge the pixel electrodes 340. When a turn off voltage is applied to the gate 220 via the scan lines 320, the thin film transistor 200 is turned off and the electrical channel formed on the bottom of the channel layer 240 is disappeared, so the charge is stored in the pixel electrodes 340. Because the ohmic contact layer 250a of the thin film transistor 200 comprises a plurality of film layers, an interface between two neighboring film layers will impede the electron migration, so that the electron mobility will be reduced slightly. But when the thin film transistor 200 is turned off, the current leakage thereof will be decreased thereby than that of conventional thin film transistor. Therefore, because the leakage current between the source 260 and the drain 270 is so tiny when the thin film transistor 200 is turned off, the charge stored in the pixel electrodes 340 will not be leaked rapidly, so as to keep the signal therein.

Table 1 shows that the comparison of the amount of current in the electrical channel between the thin film transistor having the ohmic contact layer constituted by a single film layer and another one constituted by a plurality of film layers when turned on or turned off. The most of elements of the two thin film transistors are nearly the same or similar, except for the structure of the ohmic contact layer (but the total thickness of the ohmic contact layers are equal or similar).

TABLE 1

| | current in electrical channel when turned on (pA) | current in electrical channel when turned off (pA) | initial voltage (V) | carrier mobility in electrical channel ($cm^2/s \cdot V$) |
|---|---|---|---|---|
| thin film transistor having ohmic contact layer constituted by a single film layer | 5.13 | 3.552 | 3.093 | 0.425 |

TABLE 1-continued

| | current in electrical channel when turned on (pA) | current in electrical channel when turned off (pA) | initial voltage (V) | carrier mobility in electrical channel ($cm^2/s \cdot V$) |
|---|---|---|---|---|
| thin film transistor having ohmic contact layer constituted by a plurality of film layers | 5.05 | 1.121 | 2.641 | 0.399 |

As shown in Table 1, compared to the conventional thin film transistor having an ohmic contact layer constituted by a single film layer, when the thin film transistors are turned off, the current in the electrical channel is lowered from 3.552 pA to 1.121 pA in the present invention, thin film transistor which has an ohmic contact layer constituted by a plurality of film layers. Hence, the leakage current in the electrical channel is reduced significantly when the thin film transistor is turned off in the present invention. In addition, compared with the conventional thin film transistor and the thin film transistor of the present invention, the current in electrical channel when turned on and the carrier mobility in electrical channel are closer. In other words, the present invention, the thin film transistor and the manufacturing process thereof, can reduce the leakage current thereof substantially when turned off compared to the conventional skill, and the current in electrical channel when turned on and the carrier mobility in electrical channel are not influenced so much.

In summary, the present invention, the thin film transistor and the manufacturing process thereof, has advantages as followings:

(1). Compared to the conventional skill, the ohmic contact layer of the thin film transistor according to the present invention is constituted by a plurality of film layers, although the electron mobility is decreased slightly due to interfaces between two neighboring film layers, the leakage current of the thin film transistor will be lowered significantly when turned off.

(2). Because the manufacturing process of the thin film transistor in the present invention is compatible with the manufacturing process already existed, the manufacturing process of the thin film transistor in the present invention can be executed without any additional equipments.

The above description provides a full and complete description of the embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A manufacturing process of a thin film transistor, comprising:

forming a gate on a substrate;

forming a gate insulator layer on the substrate to cover the gate;

forming a channel layer on the gate insulator layer over the gate;

forming an ohmic contact layer on the channel layer, wherein the ohmic contact layer is constituted by a plurality of N-doped amorphous silicon layers; and forming a source and a drain on the ohmic contact layer, wherein the ohmic contact layer [is] located between the source and the drain is removed.

2. The manufacturing process of the thin film transistor of claim 1, wherein a method of forming the ohmic contact layer comprises:

utilizing a deposition process, wherein a deposition power is changed during the deposition process so as to form the N-doped amorphous silicon layers to constitute the ohmic contact layer having the N-doped amorphous silicon layers.

3. The manufacturing process of the thin film transistor of claim 2, wherein a way to change the deposition power during the deposition process comprises turning off the power at a predetermined time interval during the deposition process.

4. The manufacturing process of the thin film transistor of claim 1, wherein a method of forming the ohmic contact layer comprises:

utilizing a deposition process, wherein a deposition pressure condition is changed during the deposition process so as to form the N-doped amorphous silicon layers to constitute the ohmic contact layer having the N-doped amorphous silicon layers.

5. The manufacturing process of the thin film transistor of claim 4, wherein a way to change the deposition pressure condition during the deposition process comprises changing the pressure at a predetermined time interval during the deposition process, so as to lower the deposition rate.

*6. A manufacturing process of a thin film transistor, comprising:*

*forming a gate on a substrate;*

*forming a gate insulator layer on the substrate to cover the gate;*

*forming a channel layer on the gate insulator layer over the gate;*

*forming an ohmic contact layer on the channel layer, wherein the ohmic contact layer is constituted by a plurality of N-doped amorphous silicon layers; and*

*forming a source and a drain on the ohmic contact layer, wherein at least a portion of the ohmic contact layer located between the source and the drain is removed.*

*7. The manufacturing process of the thin film transistor of claim 6, wherein forming the ohmic contact layer comprises:*

*utilizing a deposition process, wherein a deposition power is changed during the deposition process so as to form the N-doped amorphous silicon layers to constitute the ohmic contact layer having the N-doped amorphous silicon layers.*

*8. The manufacturing process of the thin film transistor of claim 7, wherein a way to change the deposition power during the deposition process comprises turning off the power at a predetermined time interval during the deposition process.*

*9. The manufacturing process of the thin film transistor of claim 6, wherein forming the ohmic contact layer comprises:*

*utilizing a deposition process, wherein a deposition pressure condition is changed during the deposition process so as to form the N-doped amorphous silicon layers to constitute the ohmic contact layer having the N-doped amorphous silicon layers.*

*10. The manufacturing process of the thin film transistor of claim 9, wherein a way to change the deposition pressure condition during the deposition process comprises changing the pressure at a predetermined time interval during the deposition process, so as to lower the deposition rate.*

* * * * *

UNITED STATES PATENT AND TRADEMARK OFFICE

CERTIFICATE OF CORRECTION

PATENT NO. : RE44,531 E
APPLICATION NO. : 13/403800
DATED : October 8, 2013
INVENTOR(S) : Hsu et al.

It is certified that error appears in the above-identified patent and that said Letters Patent is hereby corrected as shown below:

In the Specifications

In Column 3, Line 38, delete "DESCRIPTION" and insert -- DETAILED DESCRIPTION --, therefor.

In Column 5, Line 18, delete "a substrate 300," and insert -- a substrate 310, --, therefor.

Signed and Sealed this
Twentieth Day of May, 2014

Michelle K. Lee

Michelle K. Lee
*Deputy Director of the United States Patent and Trademark Office*